United States Patent [19]

Murakami

[11] Patent Number: 4,901,668
[45] Date of Patent: Feb. 20, 1990

[54] PHOTO-CHEMICAL VAPOR DEPOSITION APPARATUS

[75] Inventor: Shingo Murakami, Tokyo, Japan

[73] Assignee: NEC Corporation, Japan

[21] Appl. No.: 282,113

[22] Filed: Dec. 9, 1988

[30] Foreign Application Priority Data

Dec. 11, 1987 [JP] Japan .................... 62-313848

[51] Int. Cl.[4] ............................................ C23C 16/00
[52] U.S. Cl. ................................ 118/722; 427/53.1; 427/54.1
[58] Field of Search .................. 118/715, 722, 50.1, 118/620; 427/53.1, 54.1

[56] References Cited

U.S. PATENT DOCUMENTS

| 4,543,270 | 9/1985 | Oprysko | 427/53.1 |
|-----------|--------|---------|----------|
| 4,581,248 | 4/1986 | Roche | 427/53.1 |
| 4,595,601 | 6/1986 | Horioka | 427/53.1 |
| 4,608,117 | 8/1986 | Ehrlich | 427/53.1 |

OTHER PUBLICATIONS

G. Hearn, "Repair of Both Clear and Opaque Mask Defects", *Microelectronic Manufacturing and Testing* (Oct. 1985), pp. 19-20.

"Argon Laser Cuts Reticle Repair Time", *Lasers & Applications* (Oct. 1985), p. 34.

M. M. Oprysko et al., "Repair of Clear Photomask Defects by Laser-Pyrolytic Deposition", *Semiconductor International* (Jan. 1986), pp. 90-100

Primary Examiner—Richard Bueker
Attorney, Agent, or Firm—Ostrolenk, Faber, Gerb & Soffen

[57] ABSTRACT

In a photo-CVD apparatus, a holder on which an article is held is provided in a main chamber. The holder is moved in a predetermined direction to coincide a predetermined point of the article with a imaging point of light radiated from a light source, so that a thin film is grown on the predetermined point of the article. A process chamber is defined on the holder of the main chamber is accordance with the separation of a seal wall. Process gas is supplied to the process chamber for the growing of the thin film on the article, while inert gas is supplied to the remaining portion of the main chamber. A gas pressure of the main chamber is slightly greater than that of the process chamber, so that the process gas is prevented from flowing to the main chamber. For this structure, a size of the process chamber can be small, so that a consumption of process gas is decreased.

4 Claims, 4 Drawing Sheets

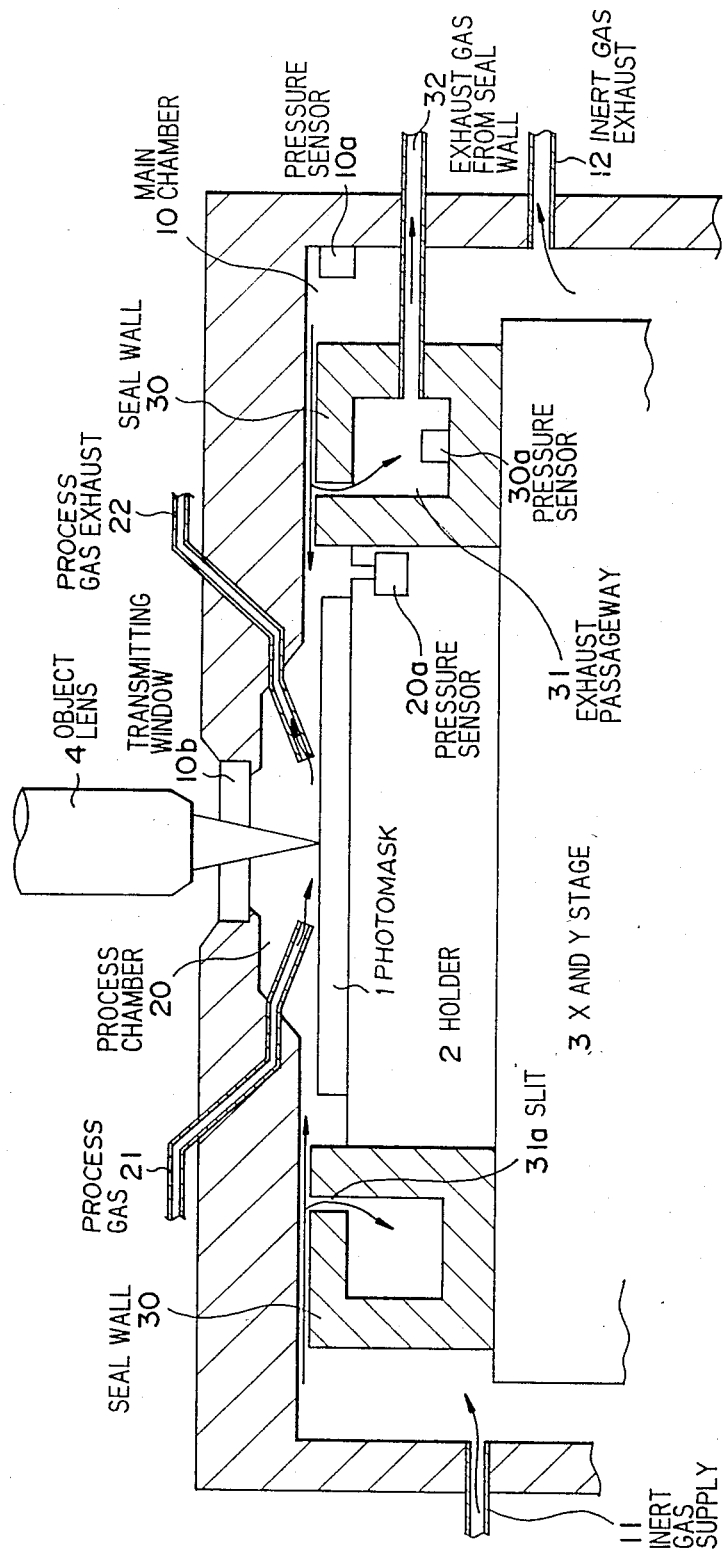

PHOTO-CHEMICAL VAPOR DEPOSITION APPARATUS

FIELD OF THE INVENTION

The invention relates to a photo-chemical vapor deposition apparatus which is used for the fabrication of a semiconductor device and the repair of clear mask defects.

BACKGROUND OF THE INVENTION

In a conventional chemical vapor deposition (simply called "CVD" hereinafter) apparatus used for the fabrication of a semiconductor device and the repair of clear mask defects, an object article such as a photomask is held on a fixed holder which is not moved during a process for growing thin films on the object article.

In a repair apparatus for reparing clear photomask defects, a photo-CVD process is utilized to grow a rectangular shaped thin film of a predetermined size on a photomask for reparing a clear defect of a photomask, however, a holder on which the photomask is held is different from the fixed holder of the conventional CVD apparatus. In more detail, an optical focusing or projecting system is utilized to selectively radiate light beam on the clear defect of the photomask, so that the rectangular shaped thin film is grown thereon. When a focusing point is changed from one clear defect of the photomask to another, the photomask is controlled to be moved dependent on the position change of the focusing point because the optical focusing or projecting system is practically impossible to be moved. For this purpose, the holder on which the photomask is held is provided in a chamber of a hermetically sealed structure in which process gas is charged, so that the holder is controlled to be moved, thereby adjusting a thin film growing position of the photomask to the focusing point.

Such a repair apparatus is described on pages 19 and 20 of "Microelectronic Manufacturing and Testing, October 1985", on page 34 of "Laser & Applications, October 1985", and on pages 90 to 100 of "Semiconductor International, January 1986".

In the conventional photo-CVD apparatus, however, there is a disadvantage that the chamber is large in size because it contains a machanism for moving the holder. For this structure, a large amount of process gas mixed of raw material gas and carrier gas must be charged into the large sized chamber in spite of the fact that an amount of the process gas which is necessary to grow a minute thin film selectively on the clear defect of the photomask is small. As a result, much amount of process gas is consumed. Thus, a supply and exhaust system of the process gas is large in size and uneconomical.

There is a further disadvantage that the conventional photo-CVD apparatus is expensive because a structure for safety must be provided to seal the entire gas flow path through which much amount of harmful process gas is circulated. In fact, reacting gas is poisonous because gas which is obtained from the sublimation of carbonyl metal such as carbonyls of Cr., Mo, W etc. is utitized.

There is a still further disadvantage that a thin film of good quality is hard to be grown because a flow control of gas in which process gas is supplied to a thin film growing position and process gas is exhausted therefrom is rather difficult.

SUMMARY OF THE INVENTION

Accordingly, it is an object of the invention to provide a photo-CVD apparatus in which a process chamber is small in size.

It is a further object of the invention to provide a photo-CVD apparatus which is inexpensive.

It is a still further object of the invention to provide a photo-CVD apparatus in which a thin film of good quality is obtained.

According to the invention, a photo-CVD apparatus comprises a main chamber which is hermetically sealed and is provided with a transmitting window for transmitting light radiated from a light source, a holder for holding an article on which a thin film is grown, said holder moving in a predetermined direction so that a predetermined point of said article is positioned to coincide with an imaging point of said light, a process chamber for containing said article and growing said thin film on said article, said process chamber being defined to have a predetermined area on said holder and under said transmitting window, a seal wall for providing a fluid resistance between said main chamber and said process chamber, said seal wall defining said predetermined area of said process chamber, an inert gas supply means for supplying inert gas to said main chamber, a gas pressure of said main chamber being greater than that of said process chamber, a process gas supply means for supplying process gas to said process chamber, a process chamber exhaust means for exhausting gas charged in said process chamber, and an inert gas exhaust means for exhausting said inert gas which is supplied from said inert gas supply means to maintain a predetermined pressure difference between said main chamber and said process chamber.

BRIEF DESCRIPTION OF DRAWINGS

The invention will be explained in more detail in conjunction with appended drawings, FIGS. 2A and 2B are a cross sectional view and a perspective view showing main and process chambers in the embodiments.

DESCRIPTION OF PREFERRED EMBODIMENTS

Figure 1:
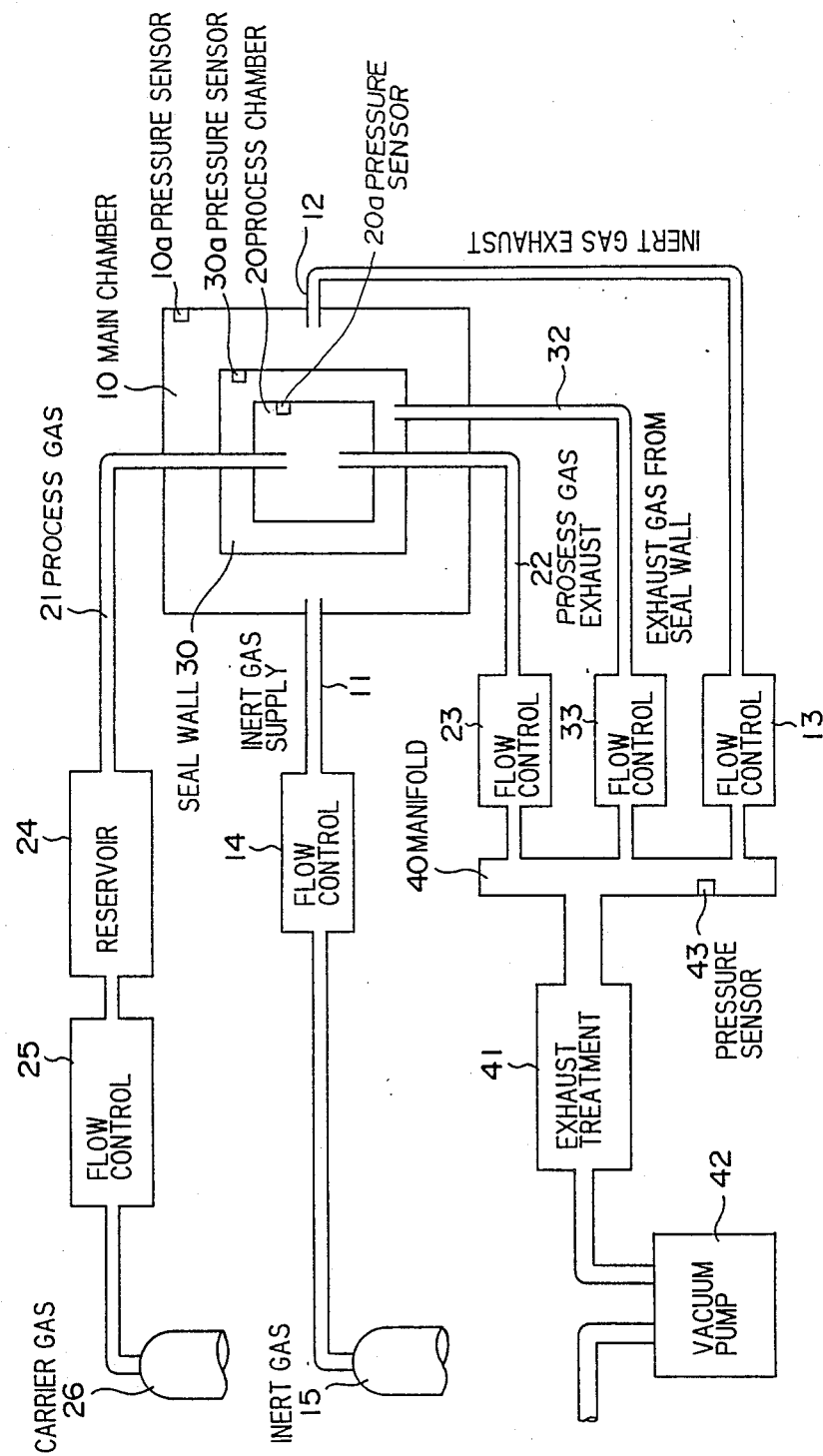
FIG. 1 is an explanatory view showing a photo-CVD apparatus in an embodiment according to the invention.

FIG. 1 shows a photo-CVD apparatus in the embodiment according to the invention. In the photo-CVD apparatus, a carrier gas supply 26 is connected to a flow controller 25 by which a flow amount of carrier gas is controlled. The flow controller 25 is connected to a reservoir 24 in which raw material gas is mixed with the carrier gas to produce process gas. The reservoir 24 is connected through a process gas supply tube 21 to a process chamber 20 in which a clear defect of a photomask is repaired. On the other hand, an inert gas supply 15 is connected to a flow controller 14 which is connected through an inert gas supply tube 11 to a main chamber 10. The process chamber 20 is separated from the main chamber by a seal wall 30. Exhaust gas flow amounts from the main and process chambers 10 and 20, and from the seal wall 30 are controlled by flow controllers 13, 23 and 33 which are connected through gas exhaust tubes 12, 22 and 32 to the main and process chambers 10 and 20, and the seal wall 30, respectively.

The flow controllers 13, 23 and 33 are connected to a manifold 40 which is connected to an exhaust treatment unit 41. Gas which is treated in the exhaust treatment unit 41 is exhausted by a vacuum pump 42, and gas pressure sensors 10a, 20a, 30a and 43 are provided in the main and process chambers 10 and 20, the seal wall 30, and the manifold 40.

Figure 2B:
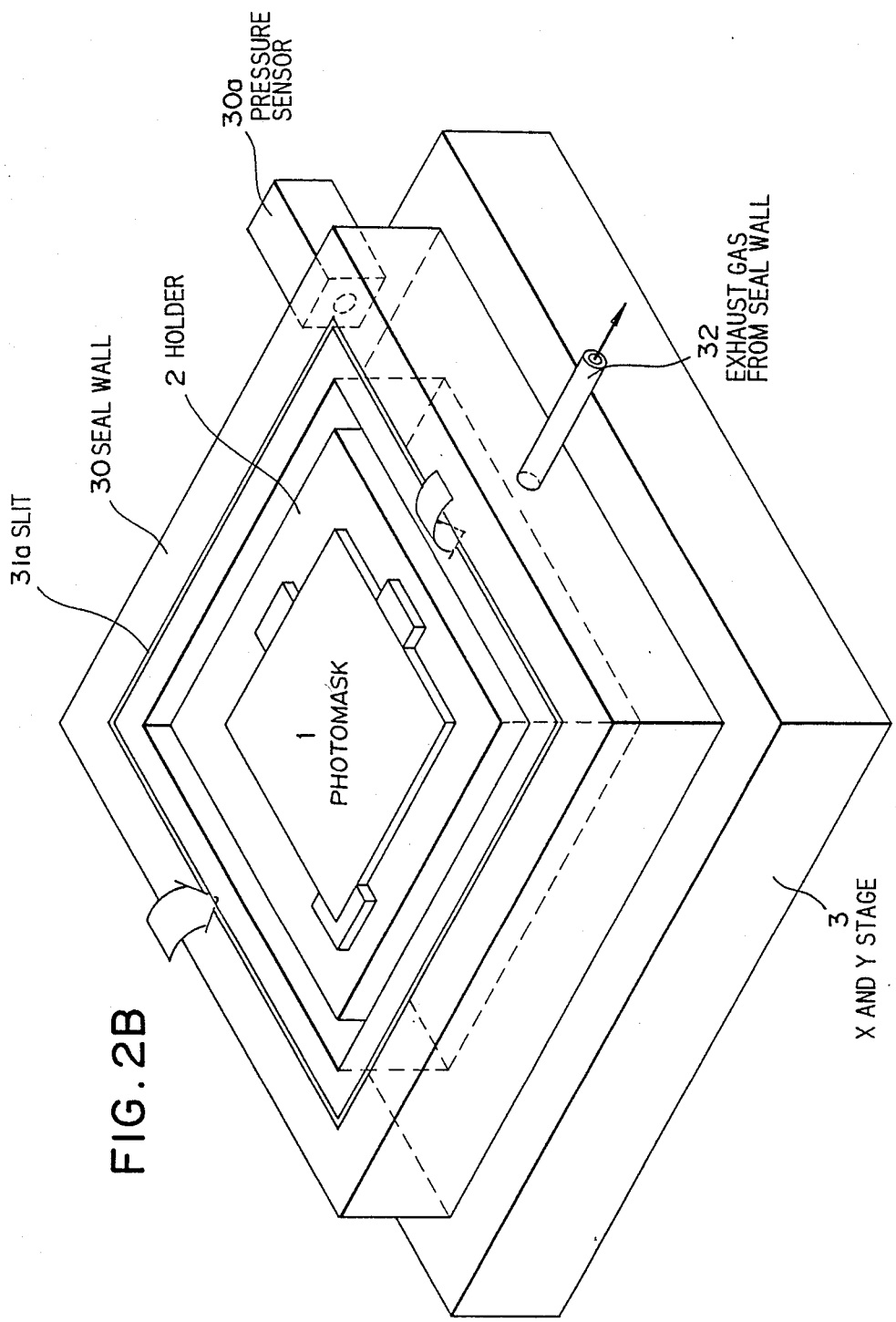

FIGS. 2A and 2B show a chamber portion including the main and process chambers 10 and 20, and the seal wall 30 wherein like parts are indicated by like reference numerals in FIG. 1. The main chamber 10 is provided with a light transmitting window 10b through which laser beam is transmitted from an object lens 4 to a photomask 1. In the process chamber 20, a holder 2 on which the photomask 1 is held is provided under the light transmitting window 10b, and on an X and Y stage 3 moving in the X and Y directions, so that the semiconductor substrate 1 takes a predetermined position in regard to laser beam focused by the object lens 4. Between the main and process chambers 10 and 20, there is provided the seal wall 30 which is also fixed on the X and Y stage 3, and has a narrow gap facing the bottom surface of an upper wall of the main chamber 10, and on exhaust passageway 31 communicated through a slit 31a with the narrow gap and directly with the gas exhaust tube 32. The narrow gap provides a predetermined fluid resistance between the main chamber 10 and the process chamber 20, and between the main chamber 10 and the passageway 31.

Figure 3:
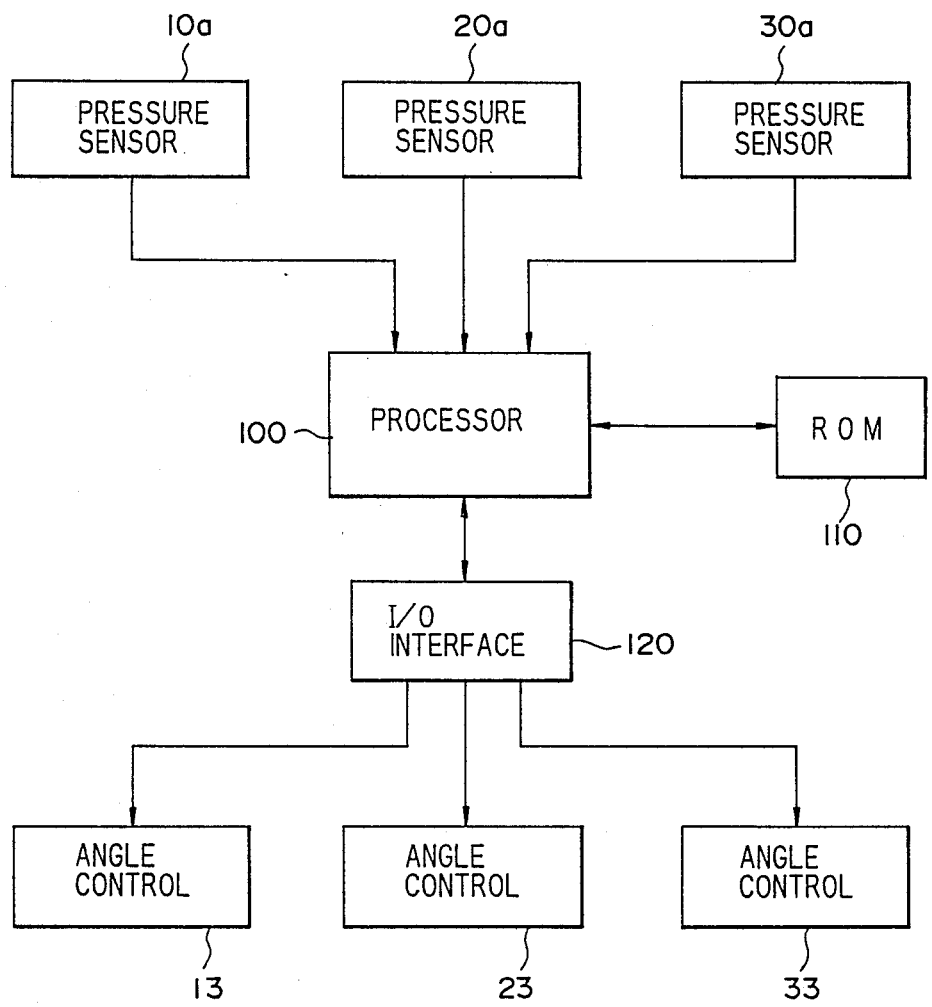
FIG. 3 is a block diagram showing a control gas flow in the embodiment.

In operation, the process gas is supplied from the process gas supply tube 21 into the process chamber 20, and exhausted therefrom through the gas exhaust tube 22. A gas pressure of the main chamber 10 is maintained to be higher slightly than that of the process chamber 20 because inert gas such as argon, nitrogen etc. is supplied from the gas supply tube 11 to the main chamber 10. For this structure, the inert gas charged in the main chamber 10 is flowed through the aforementioned narrow gap into the process chamber 20 and the exhaust passageway 31, and then exhausted through the respective exhaust tubes 22 and 32. The process gas in the process chamber 20 is flowed back to the process chamber 20 due to the inert gas flow from the main chamber 10 to the process chamber 20, so that the process gas which is harmful is not flowed into the main chamber 10 and the exhaust passageway 31 of the seal wall 30. In the situation, signals of the gas pressure sensors 10a, 20a, 30a are supplied to a processor 100 in which the signals are processed to provide control signals through an I/0 interface 120 to the flow controllers 13, 23 and 33 in accordance with programs stored in a ROM110, as shown in FIG. 3. The flow controllers 13, 23 and 33 control opening angles of flow valves provided therein for adjusting gas flow amounts of the gas exhaust tubes 12, 22 and 32, so that the gas pressures are controlled in the main chamber 10, the process chamber 20, and the seal wall 30, whereby those of the main chamber 10 and the seal wall 30 is slightly greater than that of the process chamber 20, and that of the main chamber 10 is slightly greater than that of the seal wall 30. Pressure of the manifold 40 is maintained at constant low pressure in accordance with a signal of the pressure sensor 43 regardless of the decrease and increase of the exhaust gas amounts from the gas exhaust tubes 12, 22 and 32. The exhaust gas is treated in the exhaust treatment unit 41 which includes a cold trap, a thermal decomposition heater, a filter etc., so that treated gas is exhausted through the vacuum pump 42 to the exterior of the photo-CVD apparatus.

In the embodiment, vapor from powder of a metal corbonyls such as $Cr(Co)_6$ is used as raw materials gas. A solid carbonyl metal is contained in the reservoir 24 at normal temperature and pressure. In the reservoir 24, a heater and a thermocoupler are provided to heat a carbonyl metal at a predetermined temperature, so that vapor thereof is mixed with the carrier gas from the carrier gas supply 26 to produce the process gas. The flow controller 25 includes, for instance, a regulator and a mass flow controller, and each of the flow controllers 13, 23 and 33 includes two parallel flow paths, one of which has a constant flow amount valve, and the other of which has a regulator to be controlled by the signal of the processor 100.

In the embodiment, the inert gas exhaust tube 12 is not always provided because inert gas may be exhausted through the gas exhaust tubes 22, and vise versa. Further, more than two process gas supply systems may be provided in which process gases from the systems are mixed by a predetermined mixing ratio.

As clearly understood from the above, following advantages are expected in the invention.

(1) A process chamber can be smaller because it is separated from a main chamber by a seal wall, so that a small amount of process gas is enough to grow a thin film.

(2) Therefore, a consumption of process gas is decreased, and gas supply and exhaust systems can be smaller in size, thereby providing an economical apparatus.

(3) A process chamber in which harmful process gas is charged can be smaller, so that a measure necessary for a safety is easy to be taken, thereby providing an economical apparatus.

(4) A local flow of process gas is easy to be controlled in supply and exhaust thereof because a process chamber can be small, so that a good quality of a thin film is grown.

(5) It is easy to control pressure differences among main and process chambers, and a seal wall, and an exhaust system can be simplified because exhaust tubes thereof are connected through respective flow controllers and a common manifold to an exhaust treatment unit.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A photo-CVD apparatus comprising,
   a main chamber which is hermetically sealed and is provided with a transmitting window for transmitting light radiated from a light source,
   a holder for holding an article on which a thin film is grown, said holder moving in a predetermined direction so that a predetermined point of said article is positioned to coincide with an imaging point of said light,
   a process chamber for containing said article and growing said thin film on said article, said process chamber being defined to have a predetermined area on said holder and under said transmitting window, a seal wall for providing a fluid resistance between said main chamber and said process chamber, said seal wall defining said predetermined area of said process chamber, an inert gas supply means for supplying inert gas to said main chamber, a gas pressure of said main chamber being greater than that of said process chamber, a process gas supply means for supplying process gas to said process chamber, a process chamber exhaust means for exhausting gas charged in said process chamber, and an inert gas exhaust means for exhausting said inert gas which is supplied from said inert gas supply means to maintain a predetermined pressure difference between said main chamber and said process chamber.

2. A photo-CVD apparatus according to claim 1, wherein said seal wall includes an exhaust passageway communicated with said main chamber and said inert gas exhaust means.

3. A photo-CVD apparatus according to claim 1 further comprising, a manifold which is commonly connected to said process chamber exhaust means and said inert gas exhaust means, and an exhaust treatment unit for treating gas which is supplied from said manifold.

4. A photo-CVD apparatus according to claim 2, wherein said inert gas exhaust means includes two gas exhaust means communicated with said main chamber and said exhaust passageway of said seal wall.

* * * * *